(12) United States Patent
Shin et al.

(10) Patent No.: US 8,044,490 B2
(45) Date of Patent: Oct. 25, 2011

(54) SEMICONDUCTOR DEVICE INCLUDING FUSE

(75) Inventors: Seung-woo Shin, Suwon-si (KR);
Byung-lyul Park, Seoul (KR);
Jong-myeong Lee, Seongnam-si (KR);
Gil-heyun Choi, Seoul (KR); Jong-ho Yun, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 171 days.

(21) Appl. No.: 12/502,490

(22) Filed: Jul. 14, 2009

(65) Prior Publication Data
US 2010/0193902 A1    Aug. 5, 2010

(30) Foreign Application Priority Data
Feb. 4, 2009 (KR) .................. 10-2009-0008850

(51) Int. Cl.
*H01L 29/00* (2006.01)
*H01L 27/10* (2006.01)

(52) U.S. Cl. ......... 257/529; 257/209; 257/528; 257/530

(58) Field of Classification Search .................. 257/529, 257/50, 209, 534, 638, 665, 530, 528
See application file for complete search history.

(56) References Cited

U.S. PATENT DOCUMENTS

| 6,593,172 B2* | 7/2003 | Johns .......................... 438/131 |
| 7,009,274 B2* | 3/2006 | Kim ............................. 257/529 |
| 7,589,363 B1* | 9/2009 | Cheng et al. ................. 257/209 |

FOREIGN PATENT DOCUMENTS

| JP | 2001-250867 | 9/2001 |
| JP | 2005-203688 | 7/2005 |
| KR | 97-30677 | 6/1997 |
| KR | 1020050078910 | 8/2005 |

* cited by examiner

*Primary Examiner* — Chuong A. Luu
(74) *Attorney, Agent, or Firm* — F. Chau & Associates, LLC

(57) ABSTRACT

Provided is a semiconductor device including a fuse, in which a insulating layer surrounding the fuse or metal wiring is prevented from being damaged due to the cut of a fuse, which can occur when a repair process is performed. The semiconductor device includes a conductive line formed on a semiconductor layer, a protective layer formed on the conductive line, one or more fuses that are electrically connected to the conductive line, and a fuse protective layer formed on the one or more fuses, and spaced apart from the protective layer.

17 Claims, 12 Drawing Sheets

SEMICONDUCTOR DEVICE INCLUDING FUSE

CROSS-REFERENCE TO RELATED APPLICATIONS

This application claims the benefit of Korean Patent Application No. 10-2009-0008850, filed on Feb. 4, 2009, the disclosure of which is hereby incorporated by reference herein in its entirety.

BACKGROUND (i) Technical Field

The present disclosure relates to a semiconductor device, and more particularly, to a semiconductor device including a fuse.

(ii) Description of the Related Art

As a result of the development of highly-integrated and high-capacity semiconductor memory devices, there has been an increase in the number of memory cell defects in semiconductor memory devices generated during the manufacturing of these semiconductor memory devices. To replace a defective memory cell with a redundancy cell, a repair process in which wiring, that is, a fuse connected to the defective memory cell is cut by a laser, or the like may be performed. In general, a fuse and metal wiring are formed together by using a damascene method.

SUMMARY

In accordance with an exemplary embodiment of the present invention, a semiconductor device is provided. The semiconductor device includes a conductive line formed on a semiconductor layer, a protective layer formed on the conductive line, one or more fuses that are electrically connected to the conductive line, and a fuse protective layer formed on the one or more fuses, and spaced apart from the protective layer.

The fuse protective layer may cover the one or more fuses entirely.

The fuse protective layer may be divided into one or more lines, and the one or more lines may cover the one or more fuses, respectively.

Both ends of the fuse protective layer may protrude past edges of the one or more fuses.

Both lateral surfaces of each of the one or more fuses may be covered by an insulating layer.

The conductive line and the one or more fuses may include the same material, or different materials.

The protective layer and the fuse protective layer may include the same material, or different materials. In addition, the protective layer and the fuse protective layer may include at least one of a silicon oxide, a silicon nitride, and a silicon oxynitride.

In accordance with an exemplary embodiment of the present invention, a semiconductor device is provided. The semiconductor device includes a first insulating layer formed on a semiconductor layer, a conductive line formed in the first insulating layer, a protective layer formed on the conductive line, one or more fuses formed in the first insulating layer and electrically connected to the conductive line, a fuse protective layer formed on the one or more fuses, and spaced apart from the protective layer, and a first groove formed in the first insulating layer between the protective layer and the fuse protective layer.

In accordance with another exemplary embodiment of the present invention, a semiconductor device is provided. The semiconductor device includes a first insulating layer formed on a semiconductor layer, a conductive line formed in the first insulating layer, a protective layer formed on the conductive line, one or more fuses formed in the first insulating layer and electrically connected to the conductive line, a fuse protective layer divided into one or more lines, wherein the one or more lines covers the one or more fuses, respectively, and wherein the one or more lines are spaced apart from the protective layer, a first groove formed in the first insulating layer between the protective layer and the fuse protective layer, and a second groove formed in the first insulating layer between the one or more lines of the fuse protective layer.

BRIEF DESCRIPTION OF THE DRAWINGS

Exemplary embodiments of the present invention can be more understood from the following detailed description taken in conjunction with the accompanying drawings in which.

DETAILED DESCRIPTION OF THE EXEMPLARY EMBODIMENTS

Figure 1:
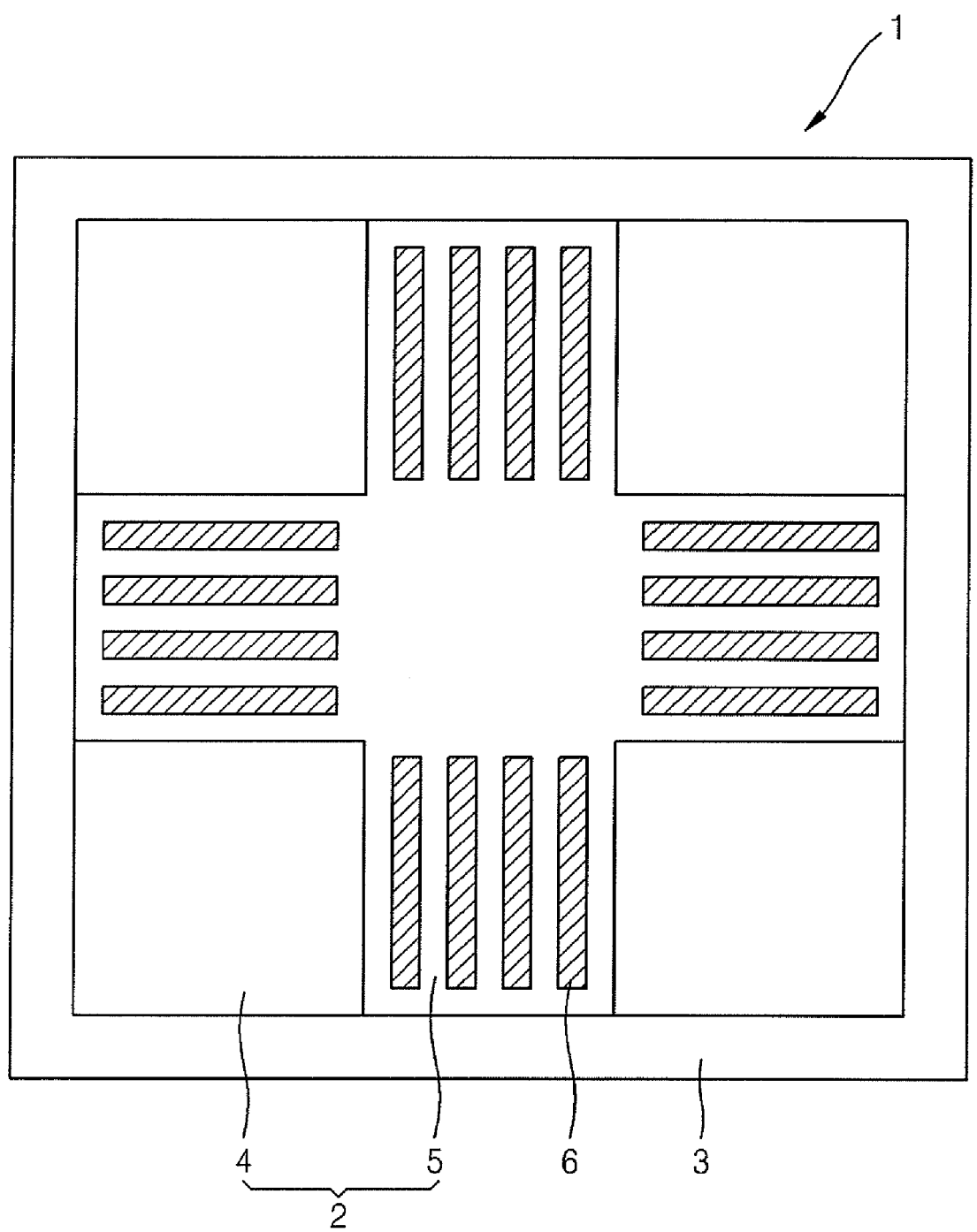
FIG. 1 is an arrangement plan view that schematically illustrates main elements of a semiconductor device according to an exemplary embodiment of the present invention.

Reference will now be made in detail to exemplary embodiments, examples of which are illustrated in the accompanying drawings. However, exemplary embodiments are not limited to the embodiments illustrated hereinafter, and the embodiments herein are rather introduced to provide easy and complete understanding of the scope and spirit of exemplary embodiments. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the exemplary embodiments of the present invention will be described in detail with reference to the accompanying drawings. In the drawings, variations from the shapes of the illustrations as a result, for example, of manufacturing techniques and/or tolerances, are to be expected. Thus, the example embodiments should not be construed as limited to the particular shapes of regions illustrated herein but may be to include deviations in shapes that result, for example, from manufacturing.

FIG. 1 is an arrangement plan view that schematically illustrates main elements of a semiconductor device 1 according to some embodiments of the present invention.

Referring to FIG. 1, a chip region 2, and a scribe line region 3 surrounding the chip region 2 are disposed on a semiconductor layer, such as a wafer, so as to embody the semiconductor device 1. The semiconductor device 1 may be embodied in, for example, a dynamic random access memory (DRAM) device. The chip region 2 includes a cell region 4 and a peripheral circuit region 5. The cell region 4 includes a plurality of memory cells (not shown). The peripheral circuit region 5 includes a plurality of peripheral circuits, for example for driving the memory cells disposed in the cell region 4. The peripheral circuits include, for example, a decoder (not shown), a buffer circuit (not shown), a redundancy circuit (not shown), a fuse unit 6, and so on.

Figure 2:
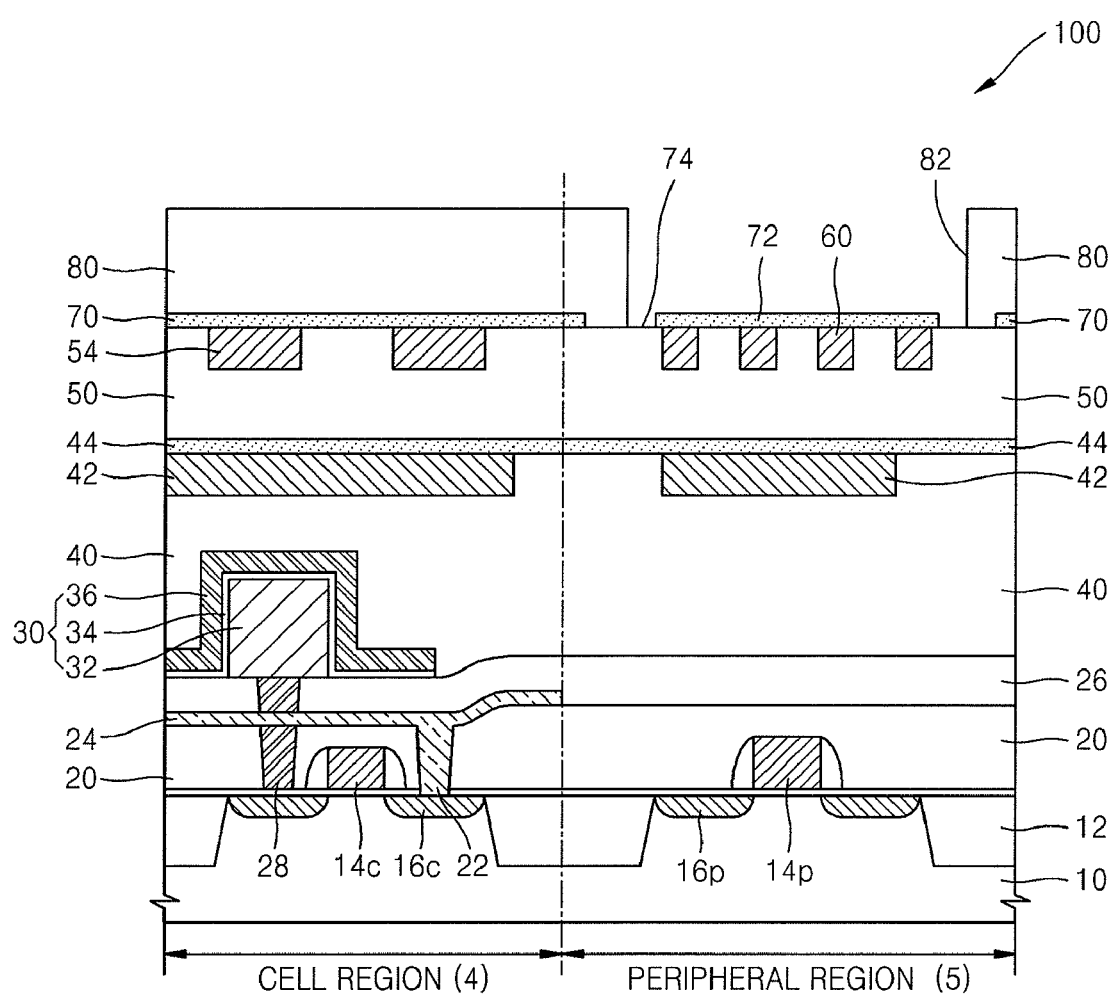
FIG. 2 is a cross-sectional view of a semiconductor device including one or more fuses, according to an exemplary embodiment of the present invention.

FIG. 2 is a cross-sectional view of a semiconductor device 100 including one or more fuses 60, according to some embodiments of the present invention.

Referring to FIG. 2, a semiconductor layer 10 includes a device separating layer 12 defining active regions. The device separating layer 12 may be, for example, a local oxidation of silicon (LOCOS) type or a shallow trench isolation (STI) type. The semiconductor layer 10 may include a substrate having a semiconductor material such as, for example, silicon or silicon-germanium, an epitaxial layer, a silicon-on-insulator (SOI) layer, and/or a semiconductor-on-insulator (SEOI) layer. The semiconductor layer 10 may be divided into a cell region 4 and a peripheral region 5. One or more cell region transistors 14c are disposed in the cell region 4, and one or more peripheral region transistors 14p are disposed in the peripheral region 5. Each cell region transistor 14c and each peripheral region transistor 14p include source/drain regions 16c and 16p, respectively, formed by, for example, injecting ions into the semiconductor layer 10. A first interlayer insulating layer 20 is disposed on and covers the cell region transistor 14c and the peripheral region transistor 14p. The source/drain region 16c of the cell region transistor 14c and a bit line 24 are electrically connected to each other by a first contact plug 22 formed through the first interlayer insulating layer 20. The first contact plug 22 may be a self-aligned contact structure. A second interlayer insulating layer 26 is disposed on and covers the bit line 24. The source/drain region 16c of the cell region transistor 14c and a lower electrode 32 are electrically connected to each other by a second contact plug 28 formed through the second interlayer insulating layer 26. The second contact plug 28 may be a self-aligned contact structure.

In FIG. 2, the lower electrode 32 is a simple stack type. However, the lower electrode 32 may be formed in various shapes, such as, for example, a cylinder or fin type. In addition, hemispherical grains may be formed on a surface of the lower electrode 32. The lower electrode 32, a dielectric layer 34, and an upper electrode 36 may constitute a storage capacitor 30. In addition, the storage capacitor 30 may include one or more conductive lines (not shown) that are electrically connected to the peripheral region transistor 14p.

A third interlayer insulating layer 40 is disposed on and covers the second interlayer insulating layer 26 and the storage capacitor 30. First wiring 42 is disposed on the third interlayer insulating layer 40. The first wiring 42 may include a conductive material such as a metal or a metal nitride, for example, tungsten (W), tungsten silicide (WSi), aluminum (Al), copper (Cu), or an alloy thereof. The first wiring 42 may be formed using, for example, a general etching method, or a damascene method. The first wiring 42 may further include, for example, a titanium (Ti) or titanium/titanium nitride (Ti/TiN) layer, and a tantalum (Ta) or tantalum nitride/tantalum (TaN/Ta) layer, formed on an upper or lower surface of the first wiring 42.

To prevent the first wiring 42 from oxidizing, a first protective layer 44 may be disposed on the first wiring 42. The first protective layer 44 may include, for example, a silicon oxide, a silicon nitride, or a silicon oxynitride.

A first wiring insulating layer 50 is disposed on the first wiring 42, and/or the first protective layer 44. A second wiring 54 and the one or more fuses 60 are disposed in the first wiring insulating layer 50. The second wiring 54 and the one or more fuses 60 may include a conductive material such as a metal or a metal nitride, for example, tungsten (W), tungsten silicide (WSi), aluminum (Al), copper (Cu), or an alloy thereof. In addition, the second wiring 54 and the one or more fuses 60 may be formed of the same material, or different materials. Each of the second wiring 54 and the one or more fuses 60 may further include, for example, a titanium (Ti) or titanium/titanium nitride (Ti/TiN) layer, and a tantalum (Ta) or tantalum nitride/tantalum (TaN/Ta) layer, formed on an upper or lower surface of each of the second wiring 54 and the one or more fuses 60. In FIG. 2, the second wiring 54 and the one or more fuses 60 are formed using a method of filling a plurality of trenches in the first wiring insulating layer 50, that is, a damascene method. However, this is only for illustrative purposes, and thus embodiments of the present invention are not limited thereto. The second wiring 54 and the one or more fuses 60 may be electrically connected to each other.

To prevent the second wiring 54 from oxidizing, a second protective layer 70 may be disposed on the second wiring 54. The second protective layer 70 may include, for example, a silicon oxide, a silicon nitride, or a silicon oxynitride.

In addition, a fuse protective layer 72 is disposed on the one or more fuses 60. The fuse protective layer 72 may prevent the one or more fuses 60 from oxidizing, and may include, for example, a silicon oxide, a silicon nitride, or a silicon oxynitride. The fuse protective layer 72 is spaced apart from the second protective layer 70 on both sides by a pair of gaps 74. The first wiring insulating layer 50 is exposed by the gaps 74 between the second protective layer 70 and the fuse protective layer 72. Both ends of the fuse protective layer 72 may protrude past the ends of the fuses 60 that are the outermost fuses from among the one or more fuses 60. This prevents the fuses 60 from deteriorating due to external surroundings. A second wiring insulating layer 80 is disposed on the second protective layer 70. The second wiring insulating layer 80 may not be disposed on the fuse protective layer 72, and the fuse protective layer 72 is exposed by a fuse opening 82. That is, the one or more fuses 60 may be substantially exposed to the outside rather than being covered by the second wiring insulating layer 80. At this time, the gaps 74 may also be exposed by the fuse opening 82. The one or more fuses 60 may constitute the fuse unit 6 of FIG. 1.

When a repair process is performed on the semiconductor device 100, the one or more fuses 60, exposed through the fuse opening 82, may be short-circuited by, for example, a laser, or the like. In addition, as the fuse protective layer 72 is spaced apart from the second protective layer 70 by the gaps 74, even if the one or more fuses 60 are damaged by a laser, the second protective layer 70 can be prevented from being damaged.

Figure 3:
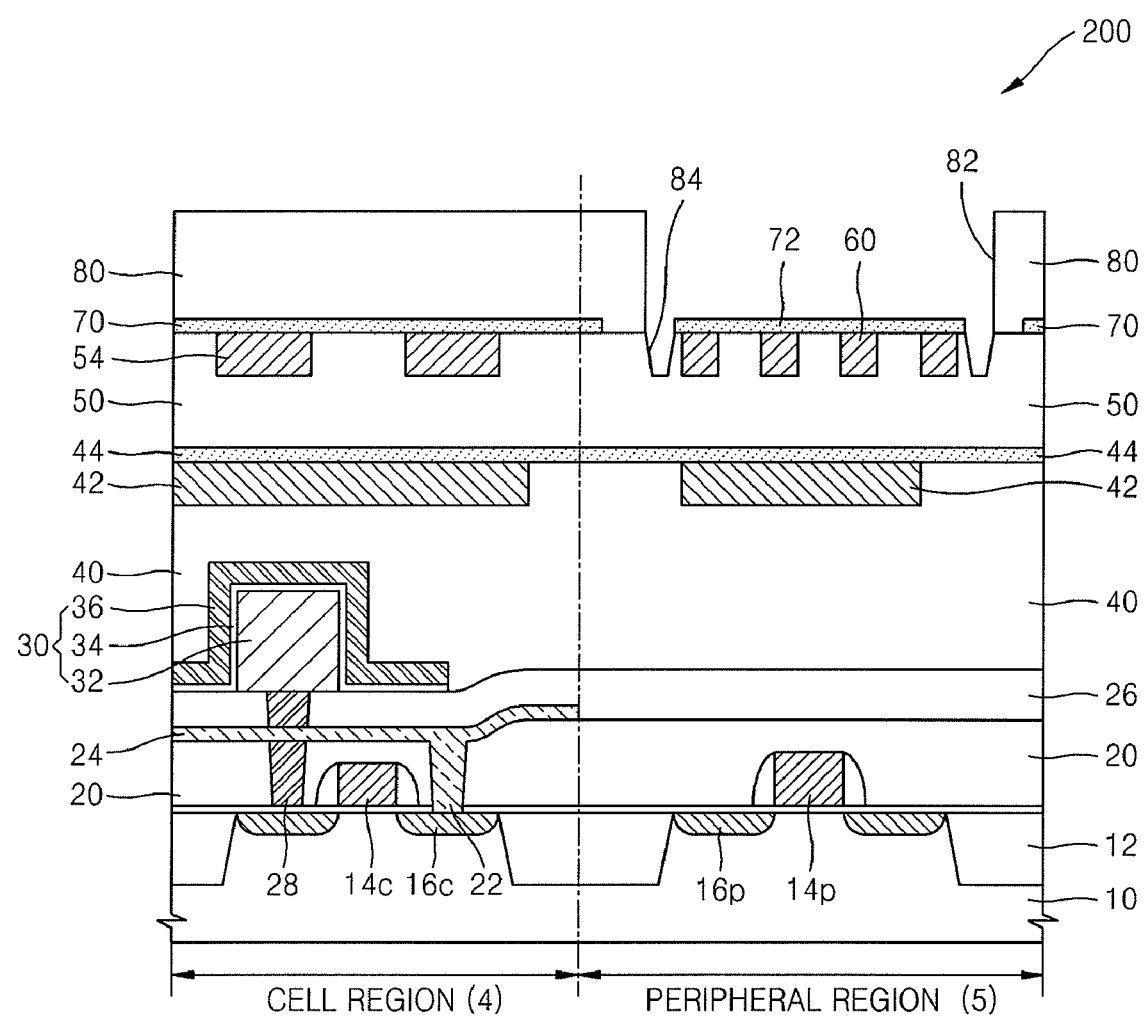
FIG. 3 is a cross-sectional view of a semiconductor device including one or more fuses, according to an exemplary embodiment of the present invention.

FIG. 3 is a cross-sectional view of a semiconductor device 200 including the one or more fuses 60, according to some embodiments of the present invention. Descriptions of elements in the semiconductor device 200 corresponding to the same elements as in the above embodiments of the present invention of FIG. 2 will not be repeated.

Referring to FIG. 3, a pair of first grooves 84 instead of the gaps 74 of FIG. 2 is formed in the first wiring insulating layer 50. The depth of the first grooves 84 may be the same as or greater than the height of each of the one or more fuses 60. However, this is only for illustrative purposes, and thus the exemplary embodiments of the present invention are not limited thereto. The fuse protective layer 72 and the one or more fuses 60 may be substantially exposed to the outside rather than being covered by the second wiring insulating layer 80.

When a repair process is performed on the semiconductor device 200, the one or more fuses 60, exposed through the fuse opening 82, may be short-circuited by, for example, a laser, or the like. As the fuse protective layer 72 is spaced away from the second protective layer 70 by the gaps 74, even if the one or more fuses 60 are damaged by a laser, the second protective layer 70 can be prevented from being damaged. In addition, the first groove 84 may prevent a crack, which occurred due to the damaging of the one or more fuses 60, from propagating into a portion of the first wiring insulating layer 50 (e.g., the portion that is adjacent to the second wiring 54).

Figure 4:
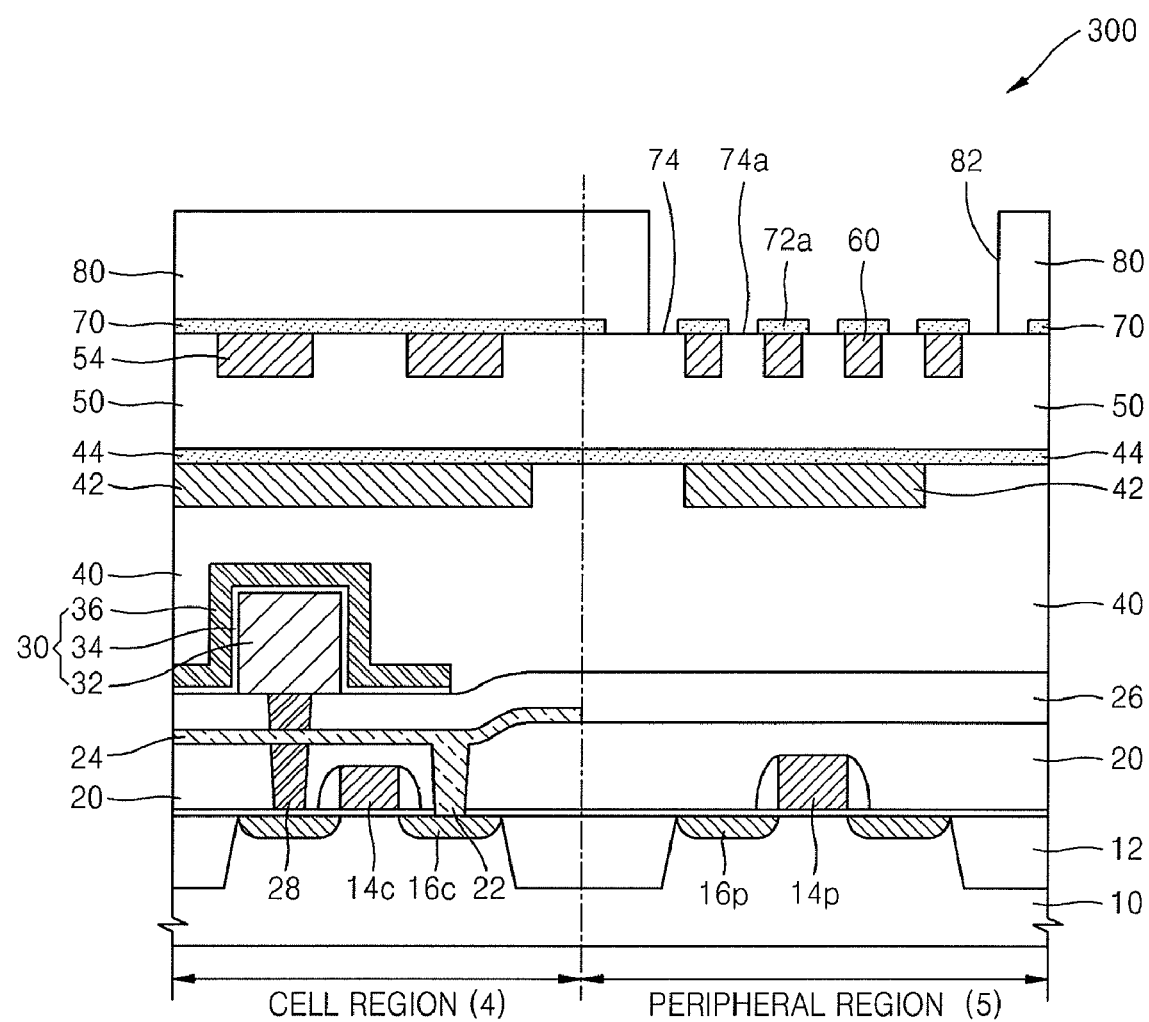
FIG. 4 is a cross-sectional view of a semiconductor device including one or more fuses, according to an exemplary embodiment of the present invention.

FIG. 4 is a cross-sectional view of a semiconductor device 300 including the one or more fuses 60, according to some embodiments of the present invention. Descriptions of elements in the semiconductor device 200 corresponding to the same elements as in the above embodiments of the present invention of FIG. 2 will not be repeated.

Referring to FIG. 4, a plurality of fuse protective layers 72a are spaced apart from each other on each of the one or more fuses 60, respectively. The fuse protective layers 72a are spaced apart from the second protective layer 70 by the gaps 74. The first wiring insulating layer 50 may be exposed by the gaps 74 between the second protective layer 70 and the fuse protective layers 72a that are the outermost fuse protective layers from among the plurality of fuse protective layers 72a. In addition, portions of the first wiring insulating layer 50 between each of the one or more fuses 60 may be exposed by a corresponding amount of wiring gaps 74a. Both ends of each of the fuse protective layers 72a may protrude past ends of each of the one or more fuses 60, covering the one or more fuses 60. This prevents the one or more fuses 60 from deteriorating due to external surroundings. In addition, the fuse protective layers 72a and the one or more fuses 60 may be substantially exposed to the outside rather than being covered by the second wiring insulating layer 80.

When a repair process is performed on the semiconductor device 300, the one or more fuses 60, exposed through the fuse opening 82, may be short-circuited by, for example, a laser, etc. As the fuse protective layers 72a are spaced apart from the second protective layer 70 by the gaps 74, even if the one or more fuses 60 are damaged by a laser, the second protective layer 70 can be prevented from being damaged. In addition, as the fuse protective layers 72a are formed so as to cover the one or more fuses 60, respectively, even if one of the one or more fuses 60 is damaged by a laser, an adjacent fuse 60 and the fuse protective layer 72a formed thereon can be protected.

Figure 5:
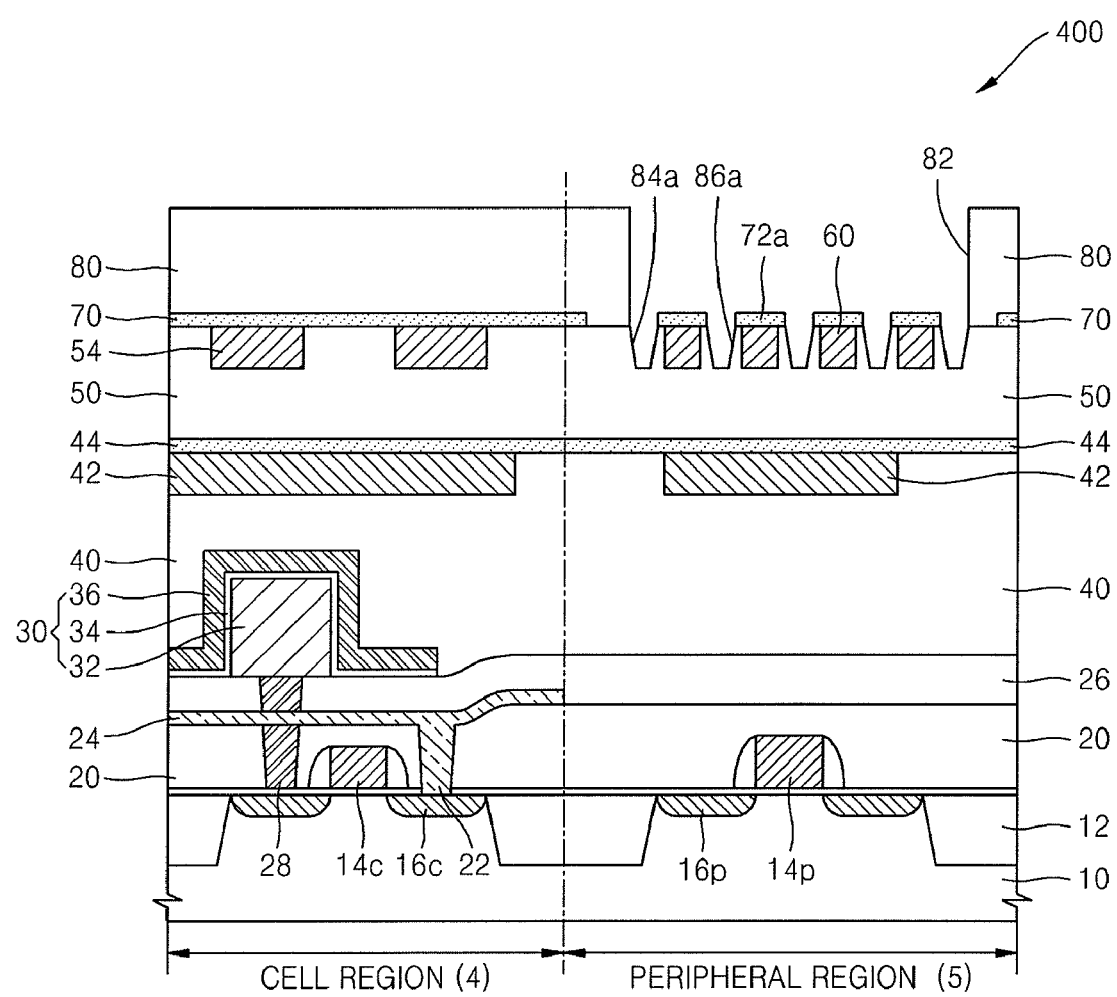
FIG. 5 is a cross-sectional view of a semiconductor device including one or more fuses, according to an exemplary embodiment of the present invention.

FIG. 5 is a cross-sectional view of a semiconductor device 400 including one or more fuses 60, according to some embodiments of the present invention. Descriptions of elements in the semiconductor device 200 corresponding to the same elements as in the above embodiments of the present invention of FIG. 2 will not be repeated.

Referring to FIG. 5, a pair of first grooves 84a, instead of the gaps 74 of FIG. 4, is formed in the first wiring insulating layer 50. In addition, a plurality of second grooves 86a is formed between each of the one or more fuses 60, and more specifically, between each of the fuse protective layers 72a, which are spaced apart from each other. The depth of each of the fuse protective layers 72a may be the same as or greater than the height of each of the one or more fuses 60. However, this is only for illustrative purposes, and thus embodiments of the present invention are not limited thereto. In addition, the fuse protective layers 72a and the one or more fuses 60 may be substantially exposed to the outside rather than being covered by the second wiring insulating layer 80.

When a repair process is performed on the semiconductor device 400, the one or more fuses 60, exposed through the fuse opening 82, may be short-circuited by, for example, a laser, etc. As the fuse protective layers 72a are spaced apart from the second protective layer 70 by the gaps 74, even if the one or more fuses 60 are damaged by a laser, the second protective layer 70 can be prevented from being damaged. The fuse protective layers 72a are formed so as to cover the one or more fuses 60, respectively, so even if one of the one or more fuses 60 is damaged by a laser, an adjacent fuse 60 and the fuse protective layer 72a formed thereon can be protected. The first grooves 84a may prevent a crack which occurred due to the damaging of the one or more fuses 60 from propagating into a portion of the first wiring insulating layer 50 (e.g., the portion being adjacent to the second wiring 54). In addition, the second grooves 86a may prevent a crack occurred due to damaging one of the one or many fuse 60 from propagating into a portion of the first wiring insulating layer 50 (e.g., the portion adjacent to the one of the fuse 60).

Figure 6:
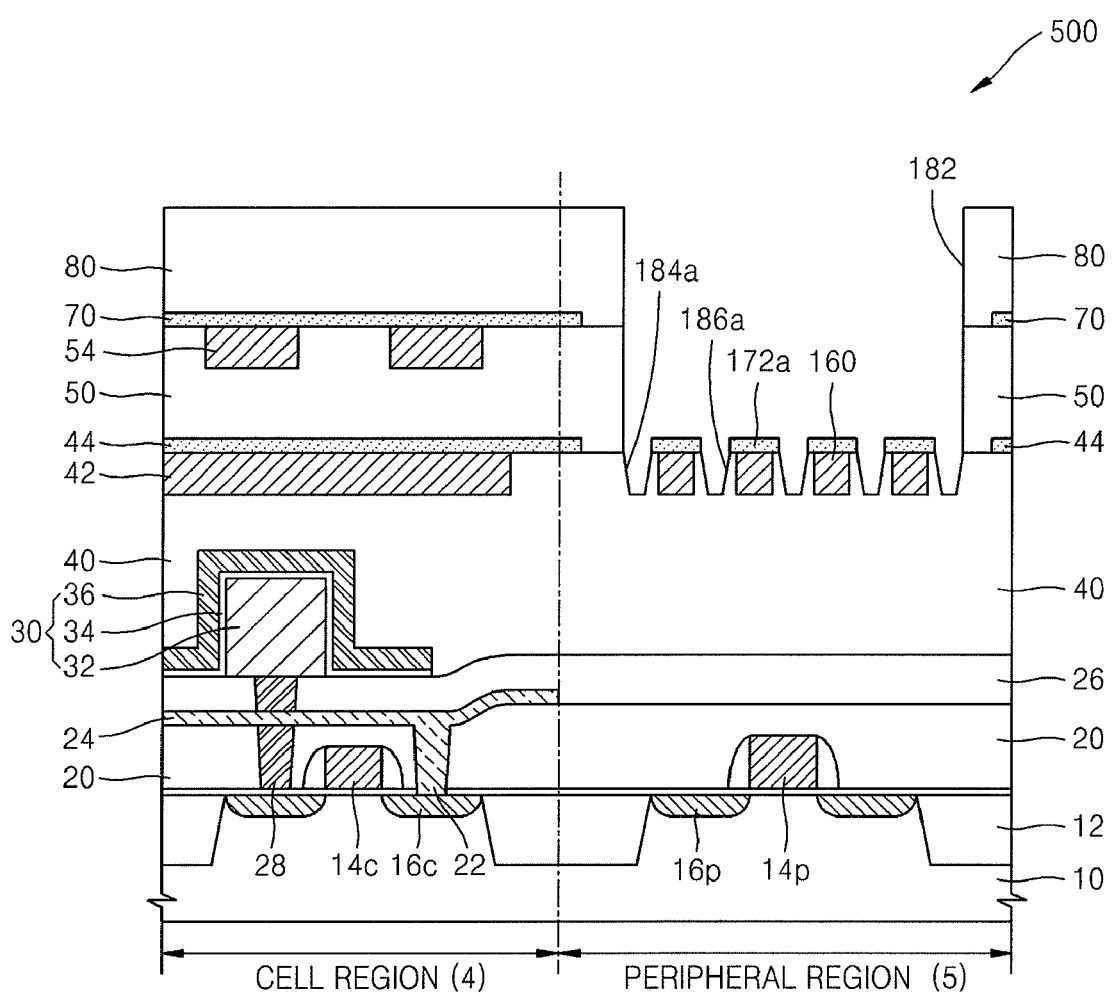
FIG. 6 is a cross-sectional view of a semiconductor device including one or more fuses, according to an exemplary embodiment of the present invention.

FIG. 6 is a cross-sectional view of a semiconductor device 500 including one or more fuses 160, according to some embodiments of the present invention. Descriptions of elements in the semiconductor device 200 corresponding to the same elements as in the above embodiments of the present invention of FIG. 2 will not be repeated.

In FIGS. 2 through 5, the semiconductor device 100, 200, 300 or 400 includes the one and more fuses 60 collectively corresponding to the second wiring 54. However, in FIG. 6, the semiconductor device 500 includes the one or more fuses 160 collectively corresponding to the first wiring 42. The one or more fuses 160 may be covered by a plurality of fuse protective layers 172a that are spaced apart from each other, respectively, as illustrated in FIG. 6. Alternatively, like the fuse protective layer 72 of FIG. 2 or 3, the one or more fuses 160 may be covered by a fuse protective layer that is formed continuously. A pair of first grooves 184a may be formed in gaps between the fuse protective layers 172a and the first protective layer 44. Alternatively, like in FIG. 2 or 4, the third interlayer insulating layer 40 may be exposed without the first groove 184a. A plurality of second grooves 186a may be formed between each of the fuse protective layers 172a. Alternatively, the third interlayer insulating layer 40 may not include the second groove 186a.

In FIGS. 2 through 6, the one or more fuses 60 or 160 are electrically connected to the second wiring 54 or the first wiring 42, and the short circuiting of the second wiring 54 or the first wiring 42 is performed by a repair process. However, this is only for illustrative purposes, and thus embodiments of the present invention are not limited thereto. That is, the fuse 60 or 160 may be electrically connected to the bit line 24 so as to function as a fuse, or alternatively, may be electrically connected to a conductive line, except for the first wiring 44 or the second wiring 54, so as to function as a fuse.

In FIGS. 2 through 6, the semiconductor 100, 200, 300, 400, or 500 may be included in a DRAM. However, this is only for illustrative purposes, and thus embodiments of the present invention are not limited thereto. That is, the semiconductor 100, 200, 300, 400, or 500 may be included in, for example, a static random access memory (SRAM) device, a non-volatile memory device, a logic device, etc.

FIGS. 7A through 7G are cross-sectional views for explaining a method of manufacturing the semiconductor device 100 or 200 including the one or more fuses 60 of FIG. 2 or 3, according to some embodiments of the present invention. For convenience of description, elements disposed below the third interlayer insulating layer 40 are not shown and will not be described.

Figure 7A:
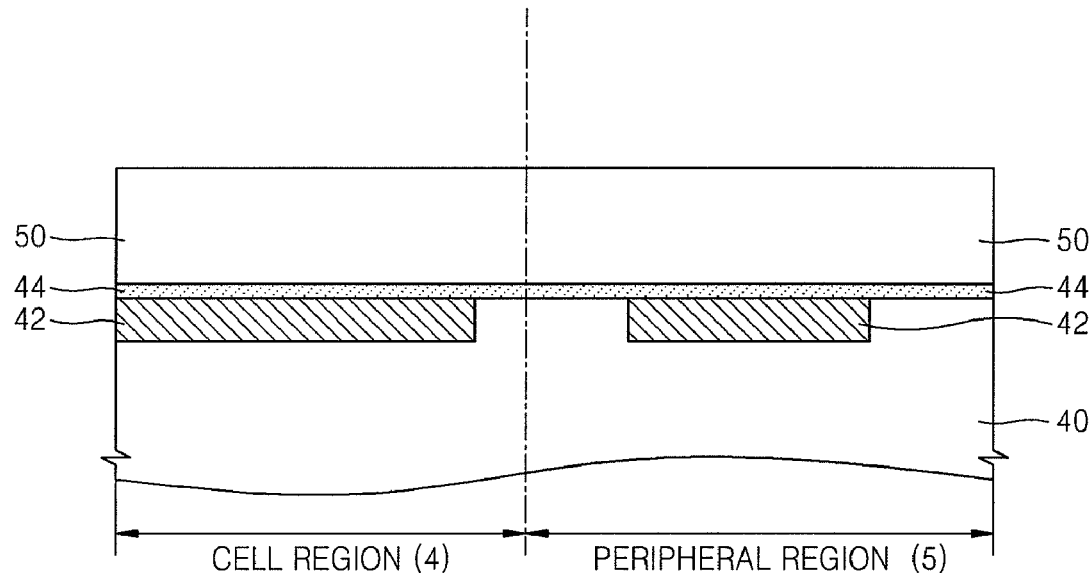
FIGS. 7A through 7G are cross-sectional views for explaining a method of manufacturing the semiconductor device including the one or more fuses of FIG. 2 or 3, according to an exemplary embodiment of the present invention.

Referring to FIG. 7A, the semiconductor layer 10 (see FIG. 2) including the cell region 4 and the peripheral region 5 is prepared. The cell region transistors 14c (see FIG. 2), the peripheral region transistors 14p (see FIG. 2), and the storage capacitor 30 (see FIG. 2) may be formed on the semiconductor layer 10. In addition, the third interlayer insulating layer 40, the first wiring 42, and the first protective layer 44 may be formed on the semiconductor layer 10, as illustrated in FIG. 2. The first wiring 42 may include, for example, tungsten (W), tungsten silicide (WSi), aluminum (Al), copper (Cu), or an alloy thereof. The first wiring 42 may be formed using, for example, a chemical vapor deposition (CVD) method, a physical vapor deposition (PVD) method, a plasma enhanced CVD (PECVD), or an atomic layer deposition (ALD) method. The first protective layer 44 may include, for example, a silicon oxide, a silicon nitride, or a silicon oxynitride. The first protective layer 44 may be formed, for example, using a CVD method, a PVD, PECVD, or ALD method.

Then, the first wiring insulating layer 50 is formed on the first wiring 42 and/or the first protective layer 44. The first wiring insulating layer 50 may include, for example, boron phosphorous silicate glass (BPSG), phosphorous silicate glass (PSG), spin-on-glass (SOG), plasma-enhanced tetraethyl-ortho-silicate (PETEOS), undoped silicate glass (USG), or densified flowable oxide (FOX). However, this is only for illustrative purposes, and thus embodiments of the present invention are not limited thereto.

Figure 7B:
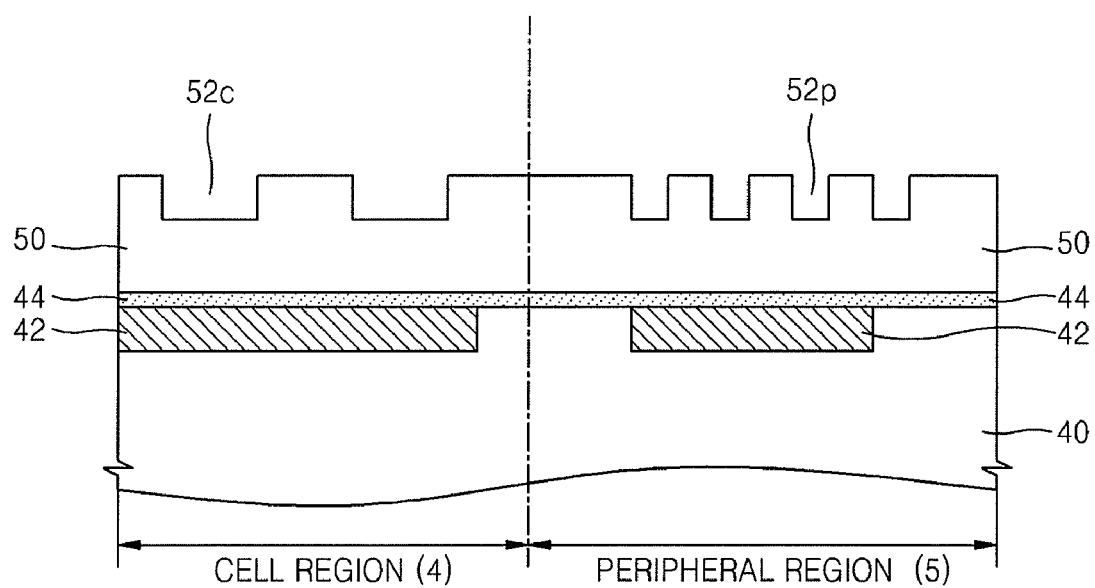

Referring to FIG. 7B, a plurality of region trenches 52c and a plurality peripheral region trenches 52p are formed by, for example, etching the first wiring insulating layer 50.

Figure 7C:
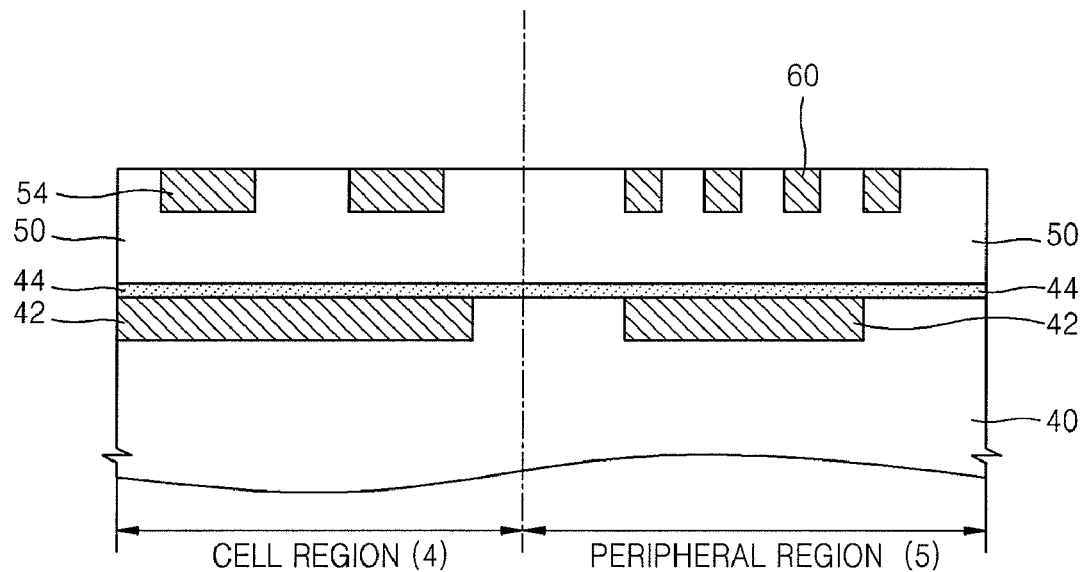

Referring to FIG. 7C, a conductive layer is formed on the first wiring insulating layer 50 so as to fill the cell region trenches 52c and the peripheral region trenches 52p using conductive material. The conductive layer may include, for example, tungsten (W), tungsten silicide (WSi), aluminum (Al), copper (Cu), or an alloy thereof. The conductive layer may be formed using, for example, a CVD, PVD, PECVD, or ALD method. Then, the conductive layer is planarized by, for example, an etch-back or chemical mechanical polishing (CMP). Thus, the second wiring 54 is formed in the cell region trenches 52c, and the one or more fuses 60 are formed in the peripheral region trenches 52p. The second wiring 54 and the one or more fuses 60 may be formed of the same material or different materials. In addition, the second wiring 54, and the one or more fuses 60 may be formed in a single process, or may be formed separately in different processes. The second wiring 54 and the one or more fuses 60 may be formed using, for example, general deposition and reflow processes.

Figure 7D:
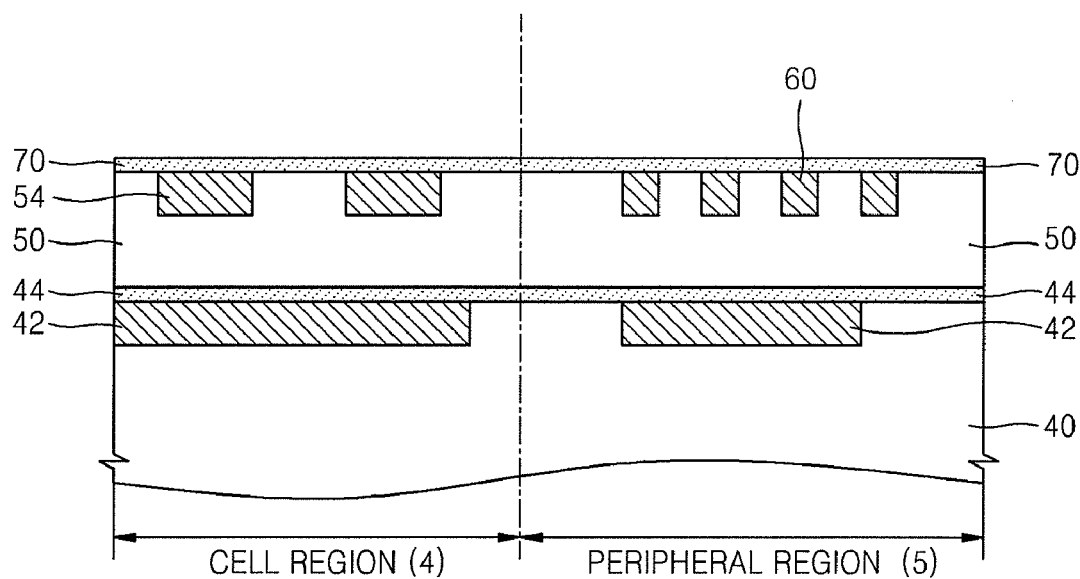

Referring to FIG. 7D, the second protective layer 70 is formed so as to cover the second wiring 54. The second protective layer 70 may include, for example, a silicon oxide, a silicon nitride, or a silicon oxynitride. The second protective layer 70 may be formed using, for example, a CVD, PVD, PECVD, or ALD method. The second protective layer 70 may be formed so as to cover the one or more fuses 60.

Figure 7E:
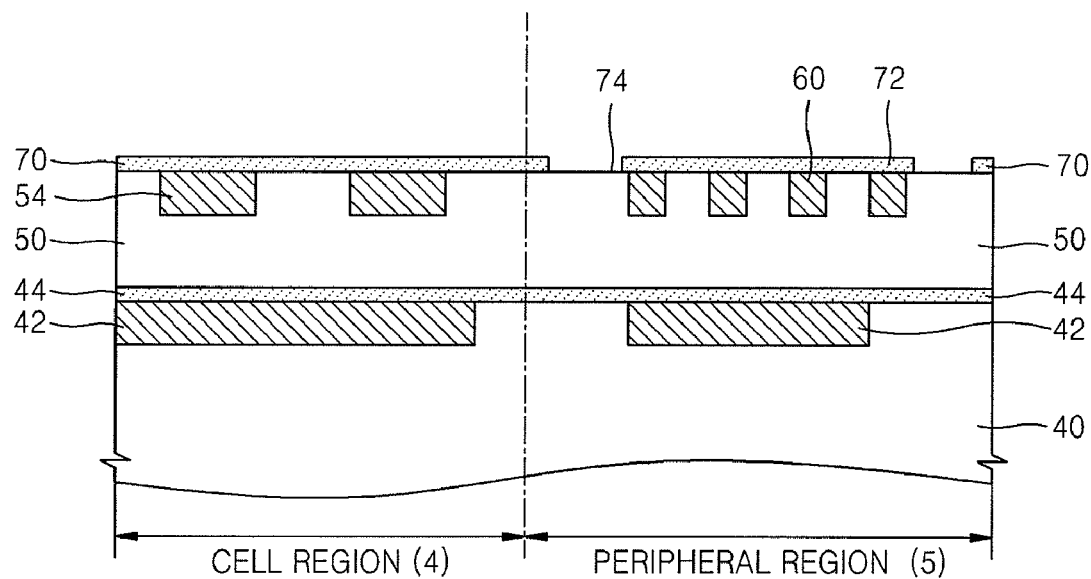

Referring to FIG. 7E, the fuse protective layer 72 is formed so as to cover the one or more fuses 60 entirely. The fuse protective layer 72 may be formed, for example, by etching a portion of the second protective layer 70. The fuse protective layer 72 is spaced apart from the second protective layer 70 by the gaps 74. The first wiring insulating layer 50 may be exposed by the gaps 74 between the second protective layer 70 and the fuse protective layer 72. Both ends of the fuse protective layer 72 may protrude past ends of the fuses 60 that are the outermost fuses from among the one or more fuses 60. This prevents the fuses from deteriorating due to external surroundings.

Figure 7F:
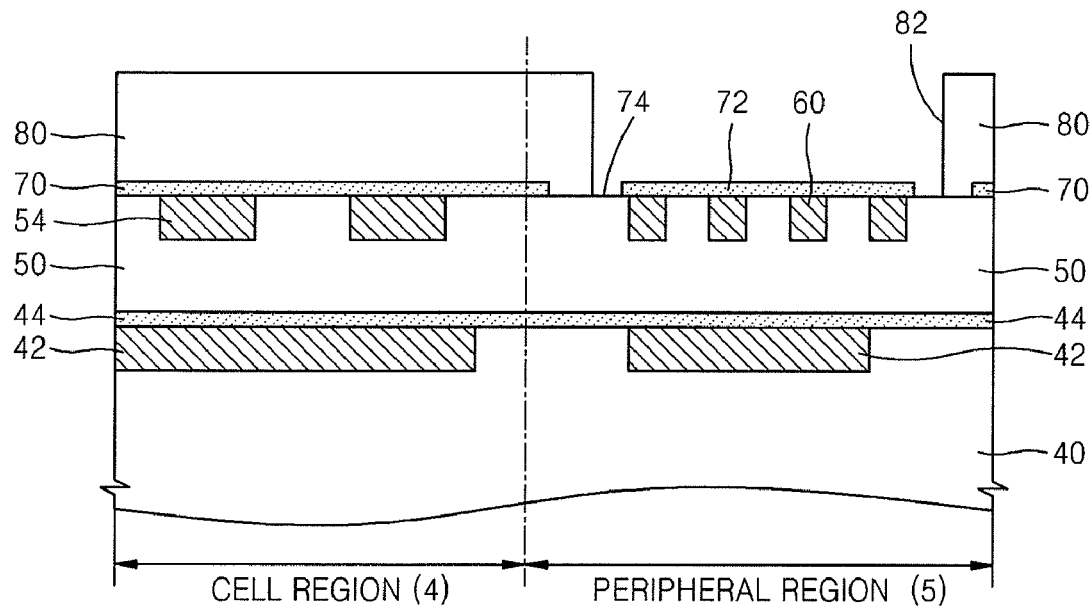

Referring to FIG. 7F, the second wiring insulating layer 80 is formed so as to cover the second protective layer 70 and the fuse protective layer 72. The second wiring insulating layer 80 may include, for example, BPSG, PSG, SOG, PETEOS, USG, or FOX. However, this is only for illustrative purposes, and thus embodiments of the present invention are not limited thereto. Then, the fuse opening 82, exposing the fuse protective layer 72, is formed by etching the second wiring insulating layer 80 formed in the peripheral region 5. The fuse opening 82 may be formed so as to expose at least portions of the gaps 74. Thus, the second wiring insulating layer 80 may be formed so as to completely cover the second protective layer 70 that is not formed on the one or more fuses 60. As the second protective layer 70 is not exposed, the penetration of moisture into the structure can be effectively prevented. If the manufacturing method is finished in the current operation of FIG. 7F, the manufacture of the semiconductor device 100 including the one or more fuses 60 of FIG. 2 can be completed.

Figure 7G:
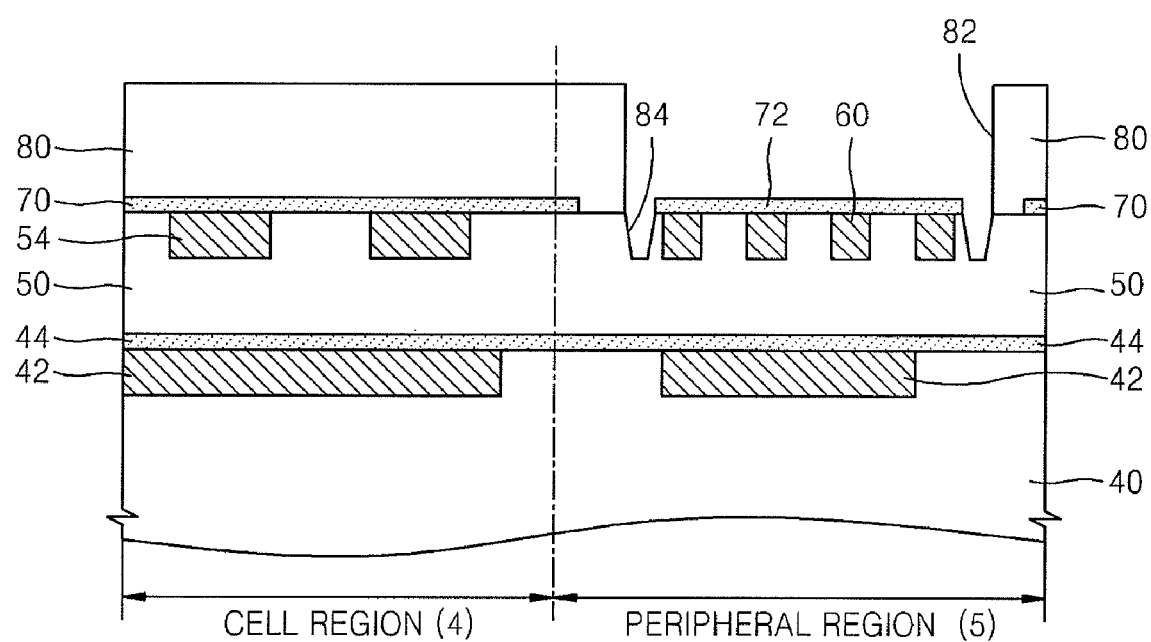

Referring to FIG. 7G, the first grooves 84 are formed by further etching the first wiring insulating layer 50 exposed between the second protective layer 70 and the fuse protective layer 72. The depth of the first grooves 84 may be the same as or greater than the height of each of the one or more fuses 60. However, this is only for illustrative purposes, and thus embodiments of the present invention are not limited thereto. If the manufacturing method is finished in the current operation of FIG. 7G, the manufacturing of the semiconductor device 200 including the one or more fuses of FIG. 3 can be completed.

Figure 8A:
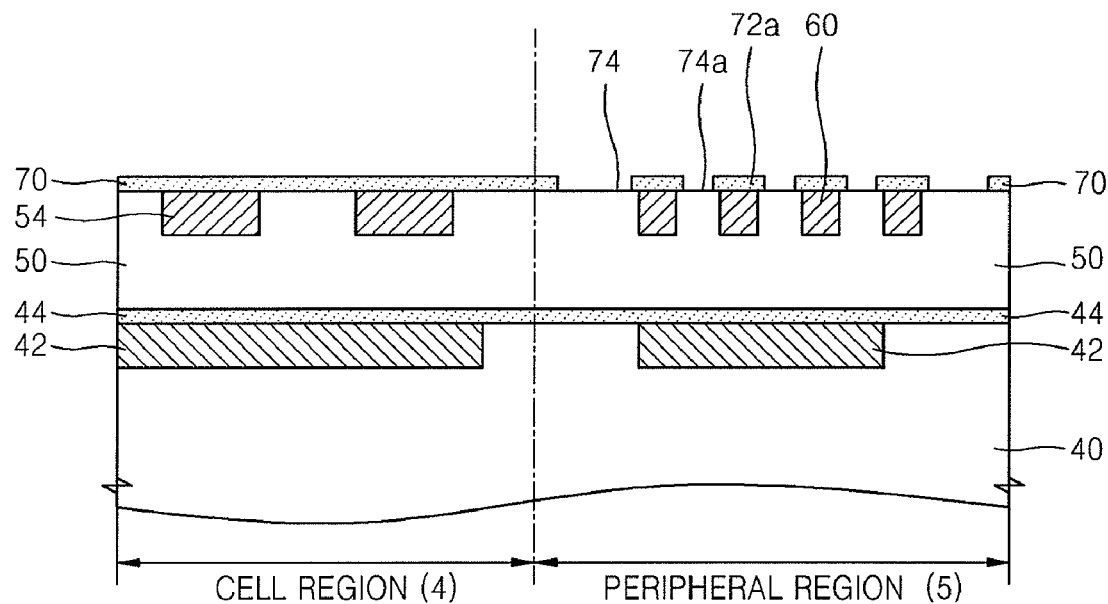
FIGS. 8A through 8C are cross-sectional views for explaining a method of manufacturing the semiconductor device including the one or more fuses of FIG. 4, according to an exemplary embodiment of the present invention.
Figure 8B:
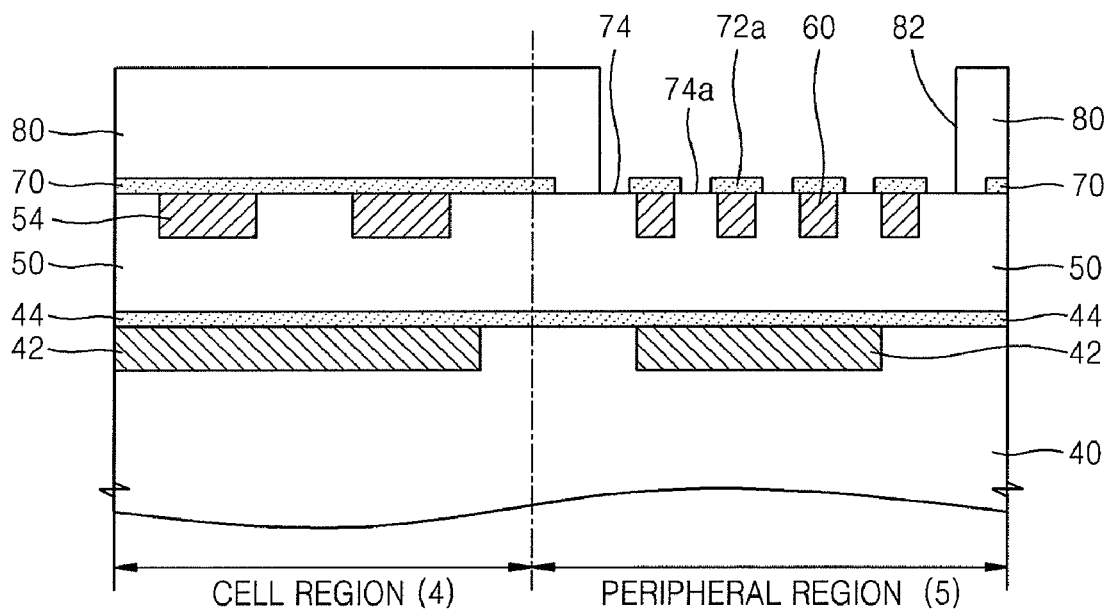
Figure 8C:
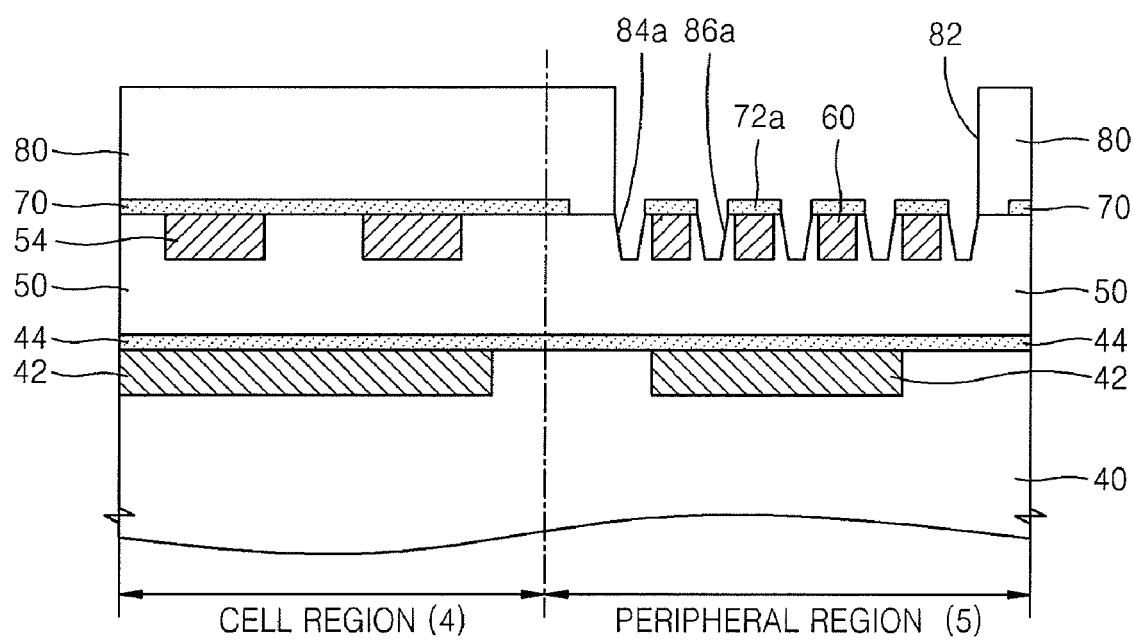

FIGS. 8A through 8C are cross-sectional views for explaining a method of manufacturing the semiconductor device 300 including the one or more fuses 60 of FIG. 4, according to some embodiments of the present invention. For convenience of description, elements disposed below the third interlayer insulating layer 40 are not shown and will not be described. In the present embodiment, the above-described operations of FIGS. 7A through 7D are performed.

Referring to FIG. 8A, the fuse protective layers 72a are formed by etching the second protective layer 70 formed in the peripheral region 5. The fuse protective layers 72a cover the one or more fuses 60, respectively. The fuse protective layers 72a are spaced apart from the second protective layer 70 by the gaps 74. The first wiring insulating layer 50 may be exposed by the gaps 74 between the second protective layer 70 and the fuse protective layers 72a that are the outermost fuse protective layers from among the fuse protective layers 72a. The first wiring insulating layer 50 between each of the one or more fuses 60 may be exposed. In addition, both ends of each of the fuse protective layers 72a that cover the one or more fuses 60, respectively, may protrude past ends of each of the fuse 60, covering the one or more fuses 60. This prevents the one or more fuses 60 from deteriorating due to external surroundings.

Referring to FIG. 8B, the second wiring insulating layer 80 is formed so as to cover the second protective layer 70 and the fuse protective layers 72a. Then, the fuse opening 82 exposing the fuse protective layers 72a is formed by etching the second wiring insulating layer 80 formed in the peripheral region 5. The fuse opening 82 may be formed so as to expose at least a portion of the gaps 74. Thus, the second wiring insulating layer 80 may be formed so as to completely cover the second protective layer 70 that is not formed on the one or more fuses 60. As the second protective layer 70 is not exposed, the penetration of moisture into the structure can be effectively prevented. Thus, the manufacture of the semiconductor device 100 including the one or more fuses 60 of FIG. 2 is completed. When the manufacturing method is finished in the current operation of FIG. 8B, the manufacture of the semiconductor device 300 including the one or more fuses 60 of FIG. 4 can be completed.

Referring to FIG. 8C, the first grooves 84a are formed by further etching the first wiring insulating layer 50 between the second protective layer 70 and the fuse protective layers 72a that are the outermost fuse protective layers from among the fuse protective layers 72a. In addition, the second grooves 86a are formed by further etching the first wiring insulating layer 50 exposed between each of the one or more fuses 60, that is, between each of the fuse protective layers 72a. The depth of each of the first grooves 84a and the second grooves 86a may be the same as or greater than the height of each of the one or more fuses 60. However, this is only for illustrative purposes, and thus, embodiments of the present invention are not limited thereto. If the manufacturing method is finished in the current operation of FIG. 8C, the semiconductor device 400 including the one or more fuses 60 of FIG. 5 can be completed.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:
1. A semiconductor device, comprising:
a first insulating layer formed on a semiconductor layer;
a conductive line formed in the first insulating layer;
a protective layer formed on the conductive line;
one or more fuses formed in the first insulating layer and electrically connected to the conductive line;
a fuse protective layer formed on the one or more fuses, and spaced apart from the protective layer; and
a second insulating layer directly formed on a top surface of the protective layer and directly formed on a portion of a top surface of the first insulating layer and wherein the second insulating layer has an opening therein which exposes a region of the first insulating layer including the fuse protective layer formed on the one or more fuses and which also exposes a gap formed on a portion of the top surface of the first insulating layer between the protective layer and the fuse protective layer.

2. The semiconductor device of claim 1, wherein the fuse protective layer covers the one or more fuses entirely.

3. The semiconductor device of claim 1, wherein the fuse protective layer is divided into one or more lines, and wherein the one or more lines covers the one or more fuses, respectively.

4. The semiconductor device of claim 1, wherein both ends of the fuse protective layer protrude past edges of the one or more fuses.

5. The semiconductor device of claim 1, wherein both lateral surfaces of each of the one or more fuses are covered by an insulating layer.

6. The semiconductor device of claim 1, wherein the conductive line and the one or more fuses comprise the same material.

7. The semiconductor device of claim 1, wherein the protective layer and the fuse protective layer comprise the same material.

8. The semiconductor device of claim 1, wherein the protective layer and the fuse protective layer comprises at least one of a silicon oxide, a silicon nitride, and a silicon oxynitride.

9. The semiconductor device of claim 1, wherein the conductive line and the one or more fuses comprise different materials.

10. The semiconductor device of claim 1, wherein the protective layer and the fuse protective layer comprise different materials.

11. The semiconductor device of claim 1, wherein the second insulating layer comprises a material selected from the group consisting of boron phosphorous silicate glass (BPSG), phosphorous silicate glass (PSG), spin-on-glass (SOG), plasma-enhanced tetra-ethyl-ortho-silicate (PE-TEOS), undoped silicate glass (USG), or densified flowable oxide (FOX).

12. A semiconductor device, comprising:
a first insulating layer formed on a semiconductor layer;
a conductive line formed in the first insulating layer;
a protective layer formed on the conductive line;
one or more fuses formed in the first insulating layer and electrically connected to the conductive line;
a fuse protective layer formed on the one or more fuses, and spaced apart from the protective layer;
a first groove formed in the first insulating layer between the protective layer and the fuse protective layer; and
a second insulating layer directly formed on a top surface of the protective layer and directly formed on a portion of a top surface of the first insulating layer and wherein the second insulating layer has an opening therein which exposes a region of the first insulating layer including the first groove and the fuse protective layer formed on the one or more fuses.

13. The semiconductor device of claim 12, wherein a depth of the first groove is the same as or greater than a height of the one or more fuses.

14. The semiconductor device of claim 12, wherein the second insulating layer comprises a material selected from the group consisting of boron phosphorous silicate glass (BPSG), phosphorous silicate glass (PSG), spin-on-glass (SOG), plasma-enhanced tetra-ethyl-ortho-silicate (PE-TEOS), undoped silicate glass (USG), or densified flowable oxide (FOX).

15. A semiconductor device, comprising:
a first insulating layer formed on a semiconductor layer;
a conductive line formed in the first insulating layer;
a protective layer formed on the conductive line;
one or more fuses formed in the first insulating layer and electrically connected to the conductive line;
a fuse protective layer divided into one or more lines, wherein the one or more lines covers the one or more fuses, respectively, and wherein the one or more lines are spaced apart from the protective layer;
a first groove formed in the first insulating layer between the protective layer and the fuse protective layer;
a second groove formed in the first insulating layer between the one or more lines of the fuse protective layer; and
a second insulating layer directly formed on a top surface of the protective layer and directly formed on a portion of a top surface of the first insulating layer and wherein the second insulating layer has an opening therein which exposes a region of the first insulating layer including the first groove, the second groove and the fuse protective layer formed on the one or more fuses.

16. The semiconductor device of claim 15, wherein a depth of each of the first and second grooves is the same as or greater than a height of the one or more fuses.

17. The semiconductor device of claim 15, wherein the second insulating layer comprises a material selected from the group consisting of boron phosphorous silicate glass (BPSG), phosphorous silicate glass (PSG), spin-on-glass (SOG), plasma-enhanced tetra-ethyl-ortho-silicate (PE-TEOS), undoped silicate glass (USG), or densified flowable oxide (FOX).

* * * * *